United States Patent
Shintani et al.

(10) Patent No.: US 12,237,145 B2
(45) Date of Patent: Feb. 25, 2025

(54) CHARGED PARTICLE BEAM DEVICE AND INSPECTION DEVICE

(71) Applicant: HITACHI HIGH-TECH CORPORATION, Tokyo (JP)

(72) Inventors: Atsuko Shintani, Tokyo (JP); Makoto Suzuki, Tokyo (JP); Hiroki Kawada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/791,013

(22) PCT Filed: Jan. 22, 2020

(86) PCT No.: PCT/JP2020/002115
§ 371 (c)(1),
(2) Date: Jul. 6, 2022

(87) PCT Pub. No.: WO2021/149188
PCT Pub. Date: Jul. 29, 2021

(65) Prior Publication Data
US 2024/0297012 A1  Sep. 5, 2024

(51) Int. Cl.
*H01J 37/22* (2006.01)
*G01N 23/2251* (2018.01)
(Continued)

(52) U.S. Cl.
CPC ........ *H01J 37/222* (2013.01); *G01N 23/2251* (2013.01); *H01J 37/1474* (2013.01); *H01J 37/244* (2013.01); *H01J 2237/3045* (2013.01)

(58) Field of Classification Search
CPC .... H01J 37/222; H01J 37/1474; H01J 37/244; H01J 2237/3045; G01N 23/2251
See application file for complete search history.

(56) References Cited

U.S. PATENT DOCUMENTS

| 2008/0251719 A1 | 10/2008 | Nakahira et al. |
| 2012/0153145 A1 | 6/2012 | Cheng et al. |
| 2013/0278745 A1 | 10/2013 | Kamio et al. |

FOREIGN PATENT DOCUMENTS

| JP | H02236938 A | 9/1990 |
| JP | 2008177064 A | 7/2008 |

(Continued)

OTHER PUBLICATIONS

Search Report mailed Apr. 7, 2020 in International Application No. PCT/JP2020/002115.

(Continued)

*Primary Examiner* — Nicole M Ippolito
*Assistant Examiner* — Hanway Chang
(74) *Attorney, Agent, or Firm* — Miles & Stockbridge, P.C.

(57) ABSTRACT

System and method for preventing blurring of an image in a scanning direction caused by a signal processing delay of a detector. of a charged particle beam device. The charged particle beam device is configured to calibrate first image data generated based on a detection signal output from a detector when the sample is two-dimensionally scanned with the charged particle beam, to generate second image data, in which the the second image data is generated using n first signal profiles each of which corresponds to a signal strength distribution in a first direction and which are extracted from the first image data, and a power spectral density P(f) (f: spatial frequency) of a window function corresponding to the signal processing delay of the detector.

17 Claims, 13 Drawing Sheets

(51) Int. Cl.
　　　*H01J 37/147*　　(2006.01)
　　　*H01J 37/244*　　(2006.01)

(56) References Cited

FOREIGN PATENT DOCUMENTS

| JP | 2012142211 A | 7/2012 |
|---|---|---|
| WO | 2011016208 A1 | 2/2011 |

OTHER PUBLICATIONS

Written Opinion mailed Apr. 7, 2020 in International Application No. PCT/JP2020/002115.
S. Maraghechi, et al., "Correction of Scanning Electron Microscope Imaging Artifacts in a Novel Digital Image Correlation Framework", Experimental Mechanics, Mar. 2019, 59, pp. 489-516.

[FIG. 1]
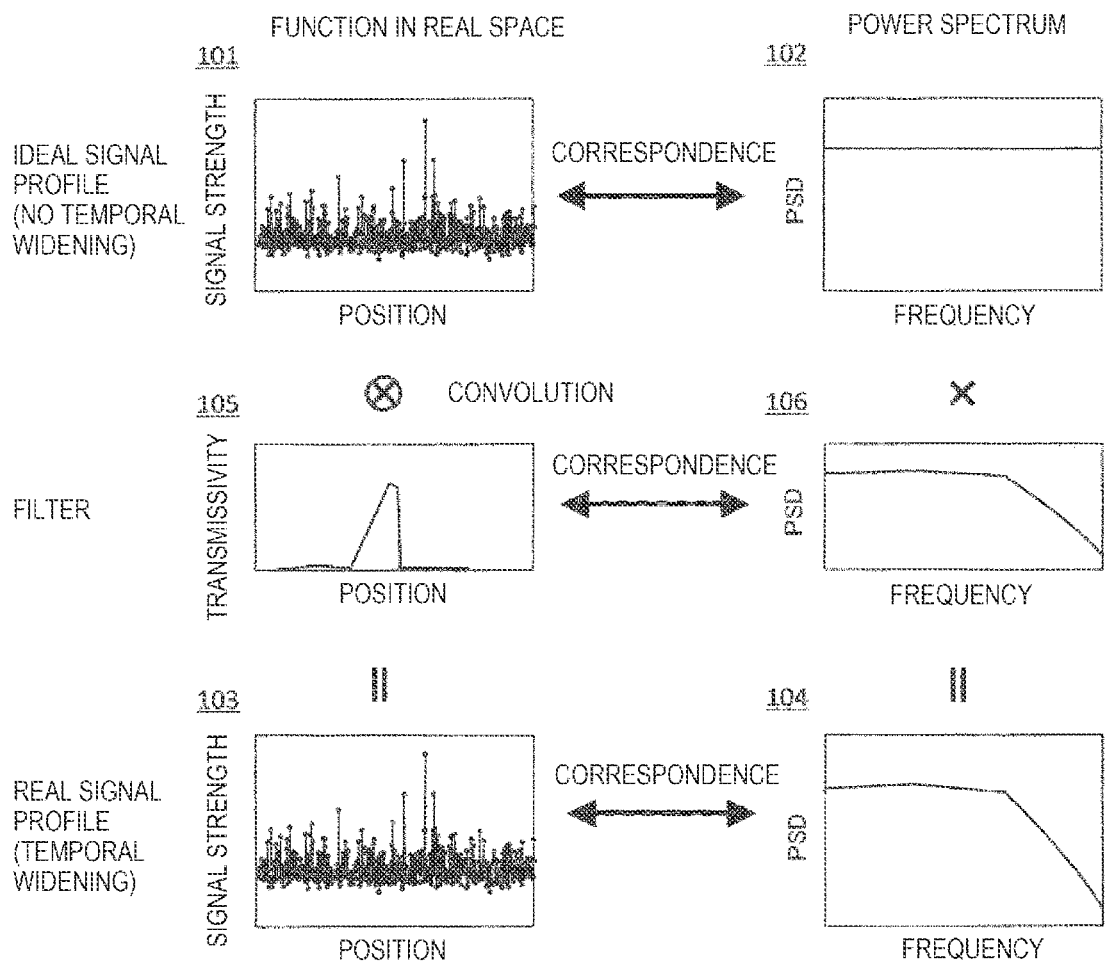

[FIG. 2]
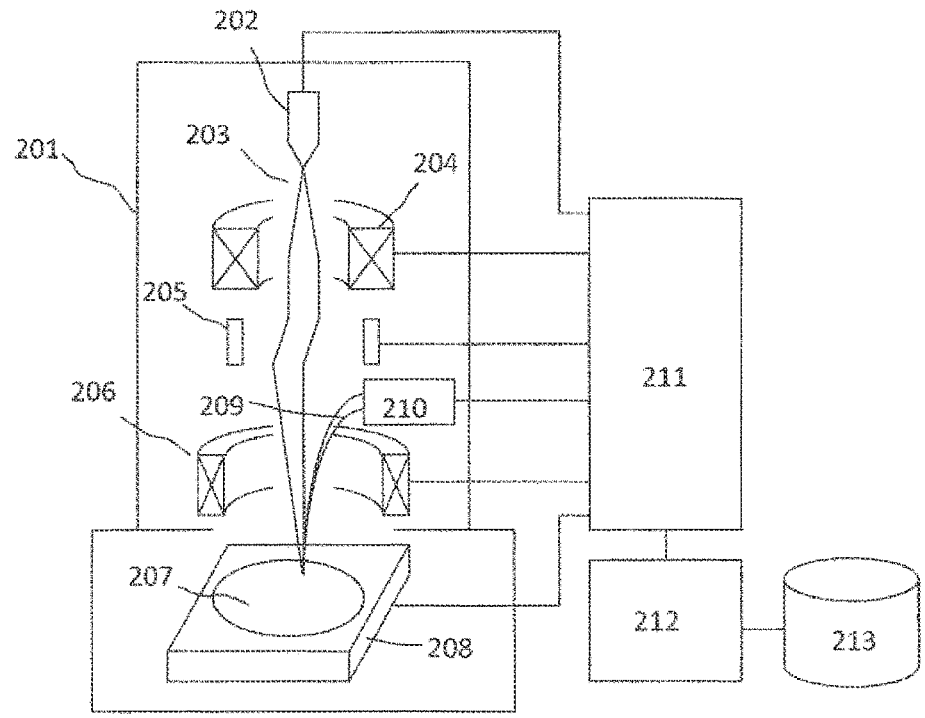
[FIG. 3]
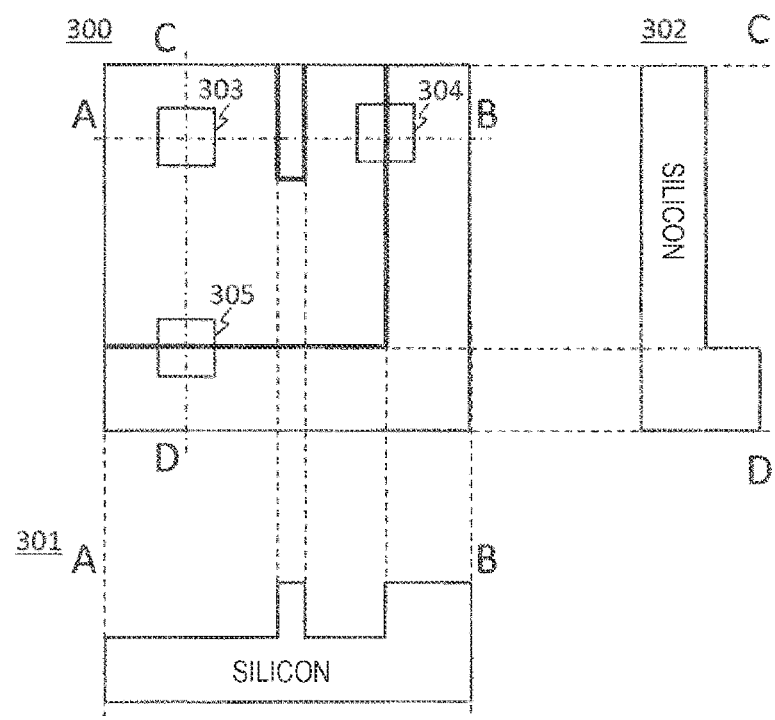

[FIG. 4]
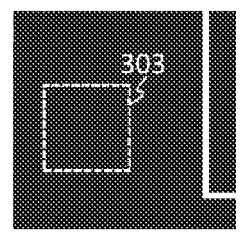

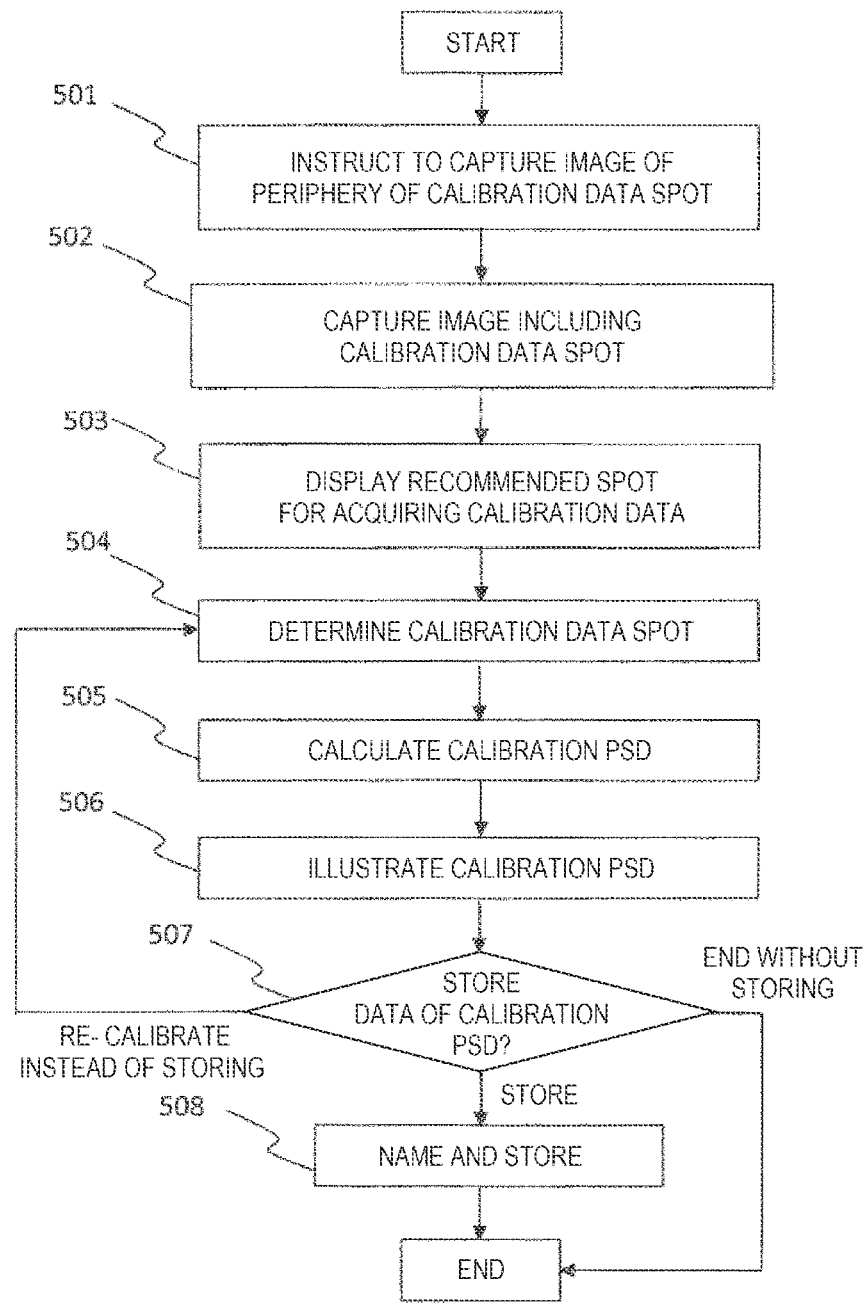
[FIG. 5A]

[FIG. 5B]
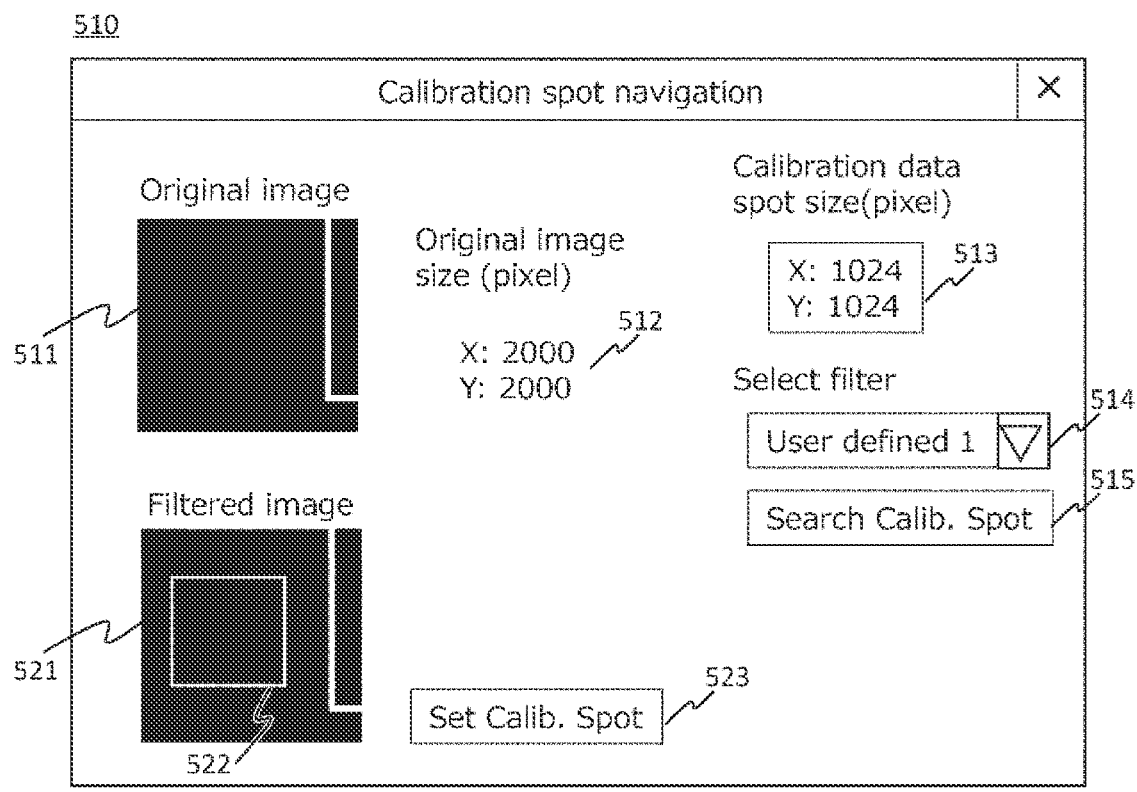

[FIG. 6]
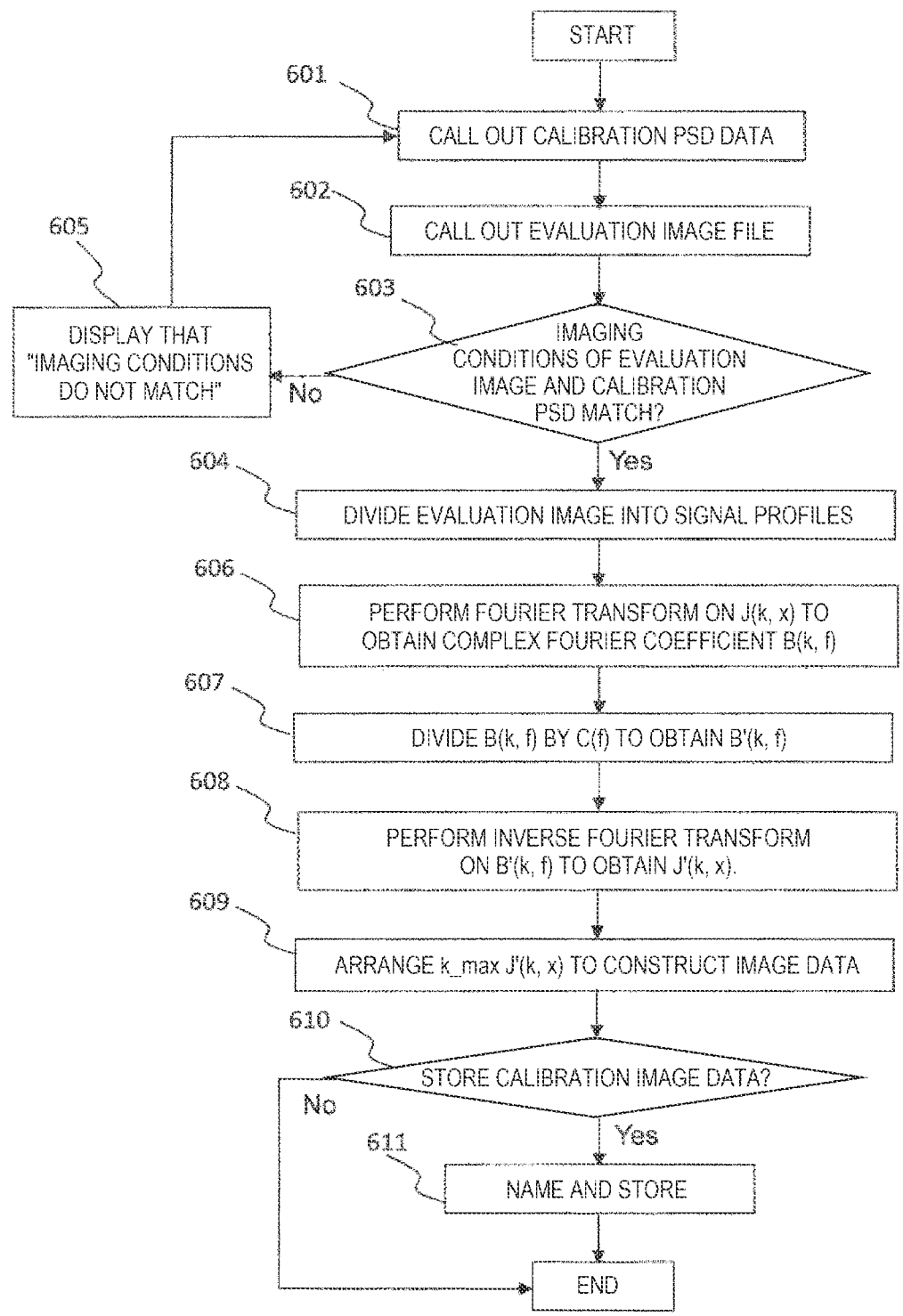

[FIG. 7]
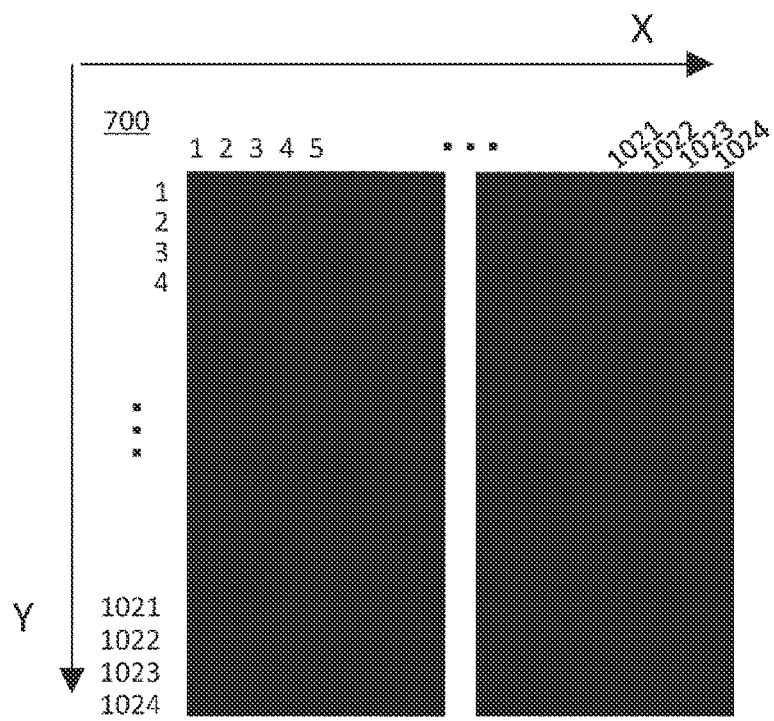
[FIG. 8A]
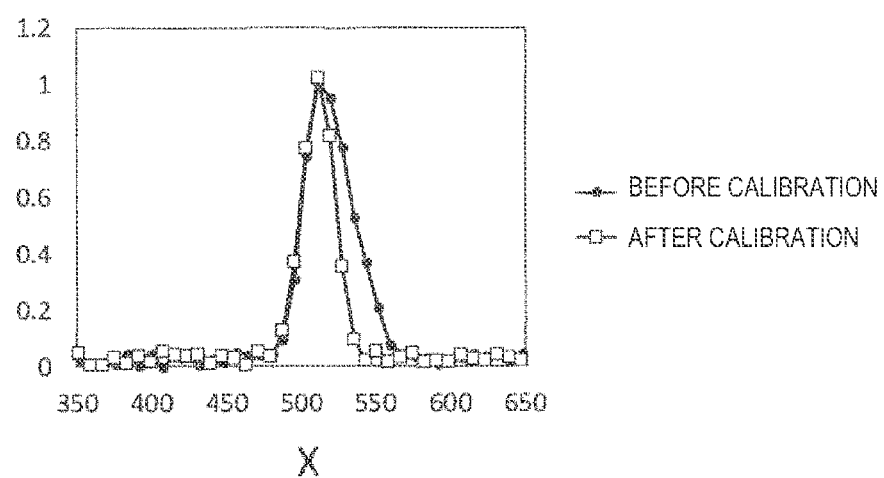

[FIG. 8B]
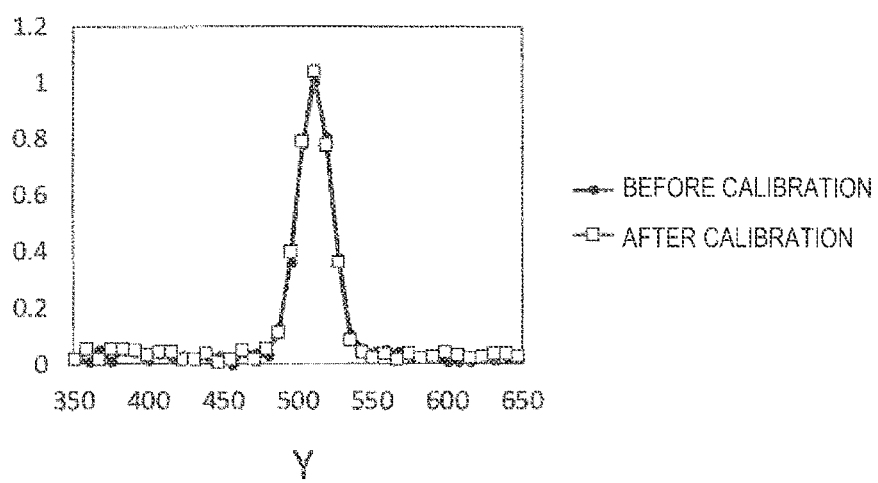
[FIG. 9]
| ACCELERATION VOLTAGE (V) | PIXEL SIZE (nm) | THE NUMBER OF PIXELS | SCANNING TIME (ms) |
|---|---|---|---|
| 500, 800 | 0.5, 1.0, 2.0 | 512 x 512, 1024 x 1024 | 2.5, 5, 10, 20, 80 |

[FIG. 10]
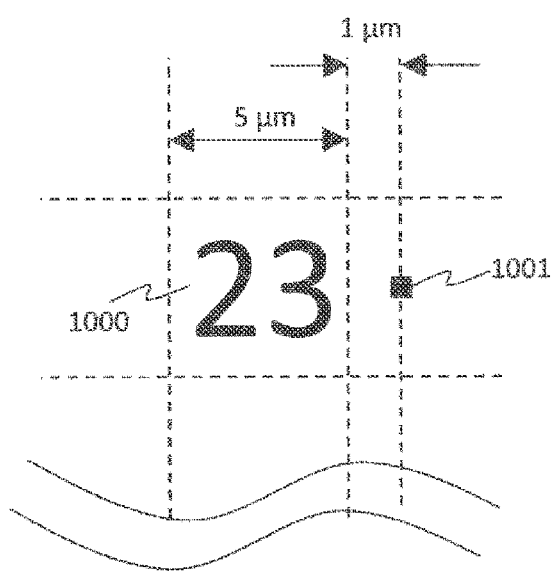

[FIG. 11]
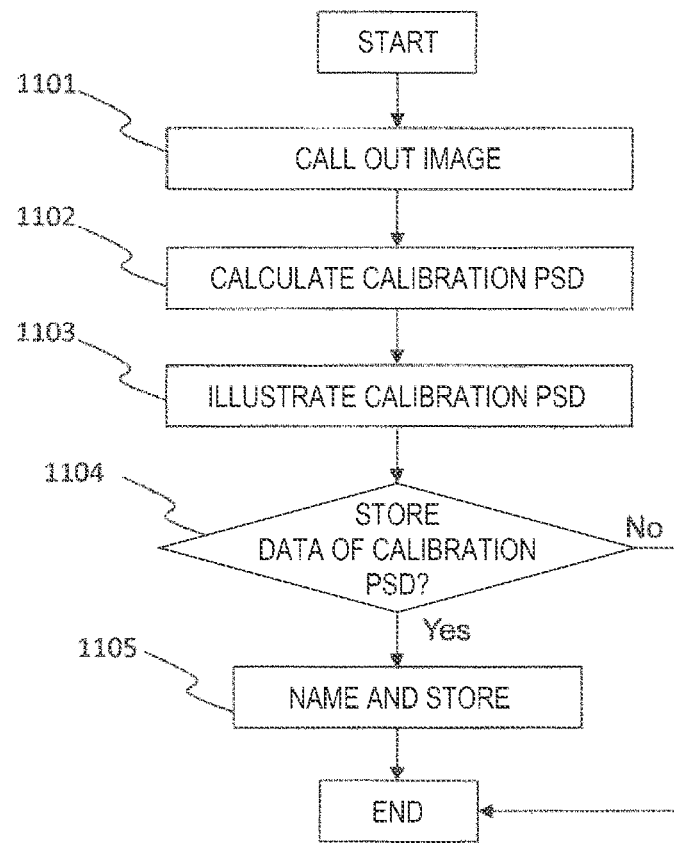

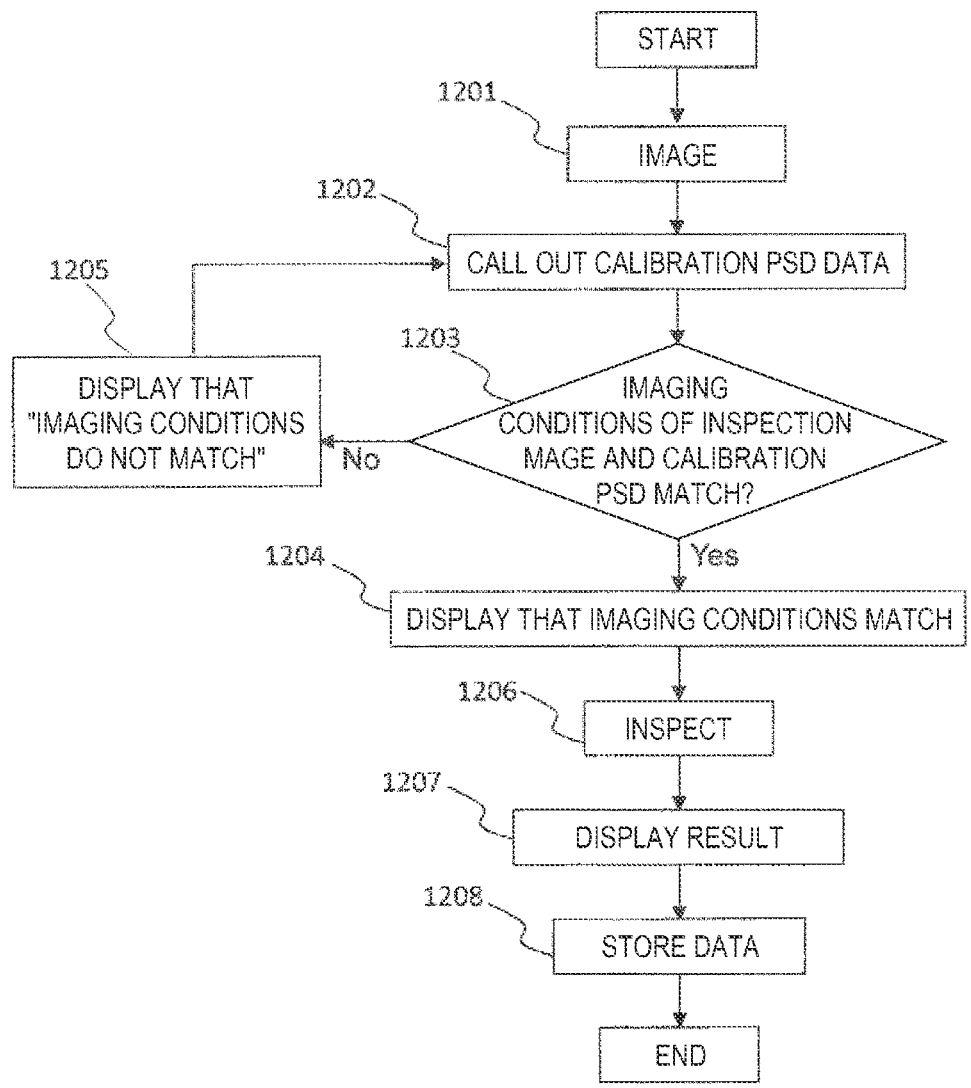
[FIG. 12]

[FIG. 13A]
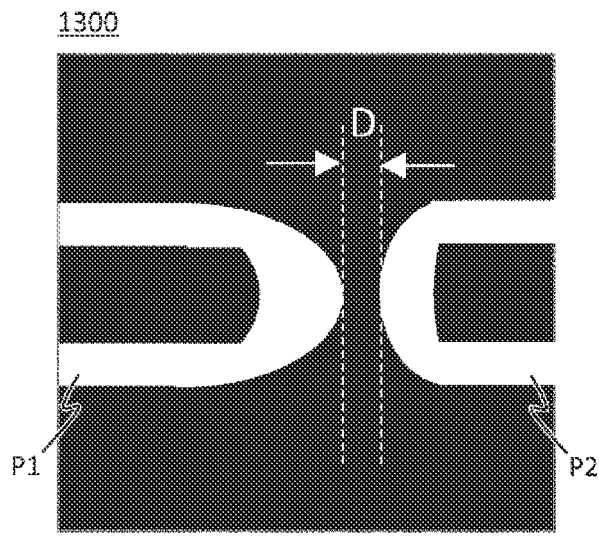
[FIG. 13B]
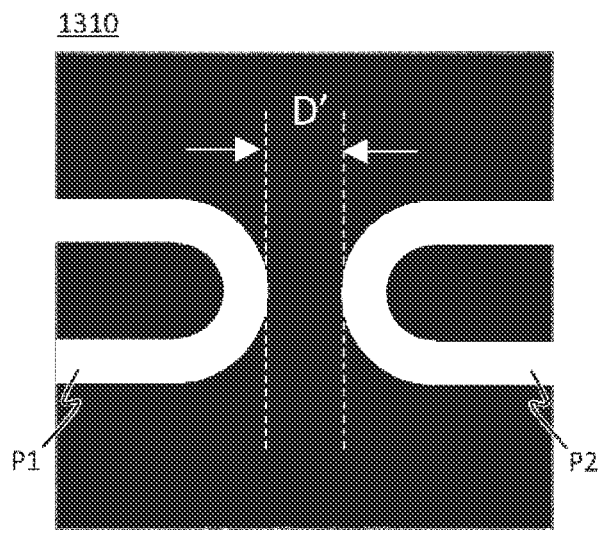

[FIG. 14]
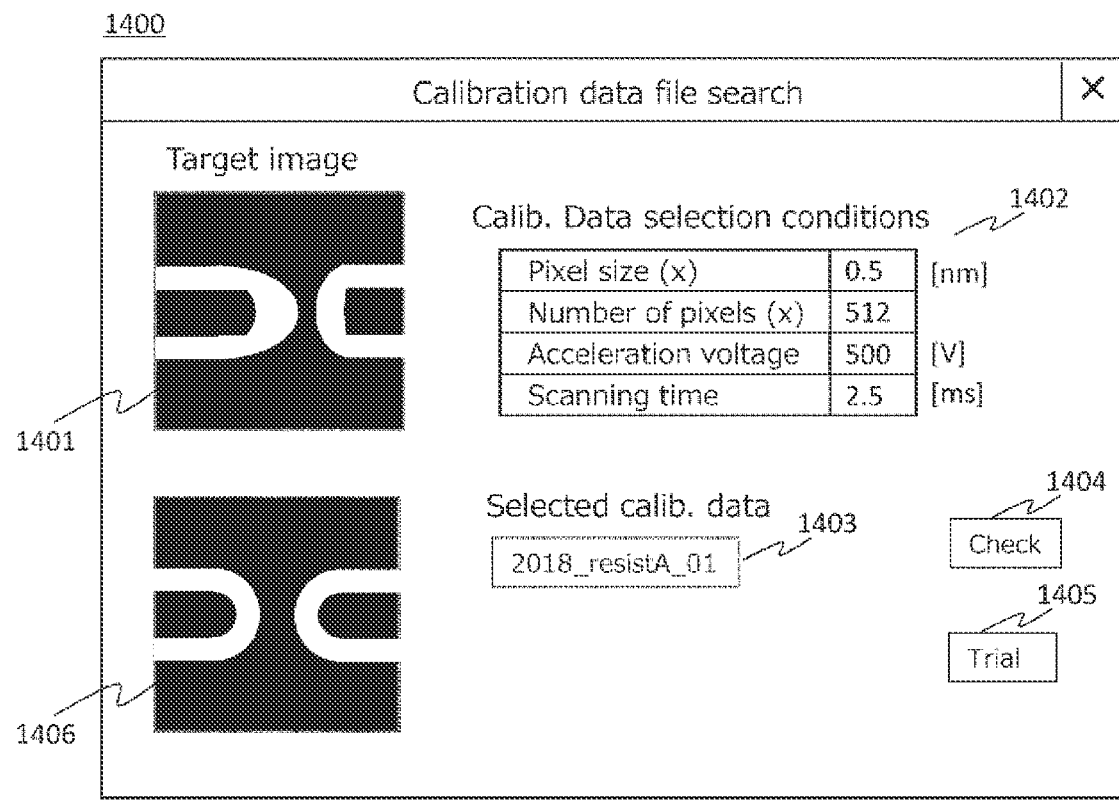

CHARGED PARTICLE BEAM DEVICE AND INSPECTION DEVICE

TECHNICAL FIELD

The present invention relates to a charged particle beam device and an inspection device.

BACKGROUND ART

In recent years, a structure of an electronic device or an optical device becomes miniaturized and more complicated, and materials to be used also become diversified. Therefore, in an inspection in a manufacturing process, it is required to measure a pattern having a finer and more complicated shape. In addition, it is required to observe a state of a smaller foreign matter or defect. For these purposes, a scanning microscope using electrons or laser light is used. In particular, a scanning electron microscope (SEM) has a high resolution. The SEM irradiates an observation target with an electron beam while scanning the observation target, and detects secondary electrons generated from the irradiated portion to acquire information of the target as an image.

The electron beam of the SEM is focused by an electron optical system, and when the electron beam collides with the observation target, the electron beam forms a spot of a nanometer order, thereby exhibiting high resolution. However, higher resolution is required due to high integration and complication of the electronic and optical devices. In general, regardless of whether an incident beam is light or an electron beam, two methods including improvements in image processing and hardware can be considered to increase the resolution of an image. The former performs calibration for increasing the resolution of the acquired image. If a point spread function (PSF), which is spatial signal widening, is obtained, an image in a case in which influence of the spatial signal widening is eliminated by image processing can be estimated. The latter further reduces a slight widening (strength distribution) of the incident beam by improving an optical system of an observation device.

At the same time, as a trend in recent years, it is required to observe patterns made of various materials such as an organic material that is likely to be damaged due to electron beam irradiation and an insulator that is likely to be charged due to electron beam irradiation. Therefore, PTL 1 discloses a technique of changing a scanning speed of an electron beam according to an observation target. If the scanning speed is decreased, a density of electrons instantaneously emitted to a certain place is increased. On the contrary, if the scanning speed is increased, the density of the electrons can be reduced to be low. A detector mainly includes a detection circuit (in narrow sense) that converts a detected secondary electron into an electric signal and an amplifier circuit for transmitting the electric signal to a circuit at a subsequent stage. When the scanning speed is increased, it is required to design a detection circuit having a high response (in broad sense, hereinafter, referred to as a detection circuit in broad sense including the detection circuit (in narrow sense) and the amplifier circuit, unless otherwise specified) in the detector.

This is because, when the response of the detection circuit is slower than the scanning speed, information of a secondary electron strength generated at a certain position is mixed into information of another secondary electron strength from a position irradiated with an electron beam thereafter. As a result, shading of an image formed based on a signal strength draws a tail in a scanning direction. In other words, a temporal information widening generated when a signal passes through the detection circuit appears as spatial blurring in a scanning direction of an incident beam in a final image. It is not desirable to increase the blurring in a fine pattern observation system that requires a high resolution and the requirement increases year by year. Hereafter, blurring in the scanning direction generated due to a signal processing delay in the detector is referred to as a temporal signal widening, and blurring generated due to an optical system is referred to as a spatial signal widening. At a time point of being in a state of an image, all of these two types of signal widening are blurring of the image and cannot be distinguished from each other.

In PTL 2, in order to easily reduce the temporal signal widening at a low cost, images of a pattern are taken at two types of scanning speeds (high and low), and calibration data for blurring in a scanning direction is obtained based on a difference between the two images. By using the calibration data, image data acquired at the high scanning speed is converted into data corresponding to a case in which the image is taken at the low scanning speed.

CITATION LIST

Patent Literature

PTL 1: WO 2011/016208
PTL 2: JP-A-2012-142211

SUMMARY OF INVENTION

Technical Problem

As described above, since a plurality of causes of lowering the resolution exist, it is required to distinguish the causes and take measures in order to improve the resolution (reduce the blurring) of the charged particle beam device. However, the measures may cause a new problem.

For example, it is not necessarily right to say that a high-resolution image can be obtained by controlling the scanning speed to such an extent that the temporal signal widening can be ignored to observe only the spatial signal widening and obtaining the PSF. First, the observation target is charged due to the decrease of the scanning speed. Even if the observation target is made of a material that is less likely to be charged, atoms and molecules slightly remaining in a vacuum may adhere to an irradiated portion, and the observation target may be deformed by energy of a beam. When the same position is irradiated with the beam for a long time, the observation target may be easily affected by vibration or the like, and a visual field deviation may occur to cause blurring in an image. That is, obtaining of correct data cannot be guaranteed by decreasing the scanning speed. As well in the method of PTL 2, since the blurring of the image acquired at the low scanning speed becomes a limit that can be reached by the calibration method, a limit in calibrating the blurring generated due to the spatial signal widening exists.

The blurring generated due to the temporal signal widening has a characteristic that the shading of the image draws a tail in a scanning direction. When a charged particle device is used for inspection and measurement of the pattern of the electronic device or the optical device, in an image affected by the temporal signal widening, a pattern shape appears as being stretched in the scanning direction due to the tailing. Therefore, a pattern formed as designed may be determined to be defective, or vice versa. Therefore, it is requested to eliminate tailing in the scanning direction from the image data for inspection and measurement. Meanwhile, although the method disclosed in PTL 2 can be applied, the blurring of the image acquired at the low scanning speed is the limit of the calibration as described above. In order to obtain the calibration data, a standard observation target which has good conductivity, to which the atoms and molecules in a vacuum are less likely to adhere, and which is less likely to be deformed due to beam irradiation needs to be introduced into the device, and overhead is also large.

An object of the invention is to easily and accurately calibrate, among a plurality of types of blurring mixed in an image acquired by a charged particle beam device, blurring of the image in a scanning direction generated due to temporal signal widening.

Solution to Problem

A charged particle beam device according to an embodiment of the invention includes: a charged particle optical system; a detector configured to detect secondary charged particles, which are emitted due to an interaction between a charged particle beam and a sample, and output a detection signal; and a calculation unit configured to calibrate first image data generated based on the detection signal output from the detector when the sample is two-dimensionally scanned with the charged particle beam, so as to generate second image data, and the calculation unit generates the second image data using signal profiles each of which corresponds to a signal strength distribution in a first direction and which are extracted from the first image data and a power spectral density P(f) (f: spatial frequency) of a window function corresponding to a signal processing delay in the detector.

Advantageous Effects of Invention

An influence of temporal signal widening generated due to a signal processing delay of a detector, that is, blurring of an image in a scanning direction can be eliminated.

Other problems and novel characteristics will become apparent from a description of the present specification and the accompanying drawings.

BRIEF DESCRIPTION OF DRAWINGS

FIG. 1 is a diagram illustrating a principle of the present embodiment.

FIG. 2 is a schematic diagram of a scanning electron microscope.

FIG. 3 is a schematic diagram of an example of a sample (a silicon wafer with a step).

FIG. 4 is a schematic diagram of an example of an image for acquiring a calibration PSD.

FIG. 5A is a flowchart of calculating the calibration PSD.

FIG. 5B is an example of a GUI screen.

FIG. 6 is a flowchart of calibrating a resolution evaluation image.

FIG. 7 is a schematic diagram of an example of the resolution evaluation image.

FIG. 8A is a graph showing a signal strength distribution of an image before the calibration.

FIG. 8B is a graph showing a signal strength distribution of an image after the calibration.

FIG. 9 is a table of imaging conditions for acquiring the calibration PSD.

FIG. 10 is a diagram showing a layout example of the sample used for acquiring the calibration PSD.

FIG. 11 is a flowchart of calculating the calibration PSD under each of the imaging conditions.

FIG. 12 is an inspection flowchart.

FIG. 13A is a schematic diagram of an example of an inspection image before calibration.

FIG. 13B is a schematic diagram of an example of an inspection image after the calibration.

FIG. 14 is an example of a GUI screen.

DESCRIPTION OF EMBODIMENTS

A principle of the present embodiment will be described with reference to FIG. 1. Here, a scanning direction of a charged particle beam device is defined as a horizontal direction of a captured image, and the horizontal direction is defined as an X-direction. A graph 101 shows data (for example, brightness of a pixel) in a real space, a horizontal axis represents an X coordinate in the image, and a vertical axis represents a signal strength at a position of the image. A graph 102 shows an expected value of a power spectrum (hereinafter, referred to as "PSD") calculated based on a coefficient obtained by performing Fourier transform on the signal strength shown in the graph 101. The horizontal axis represents a frequency, and the vertical axis represents the PSD at the frequency. Hereinafter, an X-direction distribution of the signal strength is referred to as a signal profile.

The graph 101 shows an example of the signal profile in a case in which no temporal signal widening occurs (the signal profile is referred to as an ideal signal profile), and in particular, is a signal profile extracted from an image of a spot where a material and a shape are constant, that is, a value expected as the signal strength is uniform unless a signal variation occurs (hereinafter, referred to as a spot where the expected value of the signal strength is uniform), on a surface and inside of a sample that affects the signal strength. The graph 102 shows the expected value of the PSD obtained based on the ideal signal profile of the graph 101. In an observation spot corresponding to the graph 101, if the shape and the material of the sample do not have non-uniformity, the ideal signal profile of the graph 101 are random values, and values of the PSD of one ideal signal profile are distributed with a variation around the expected value (constant function) of the PSD shown in the graph 102.

Meanwhile, the graph 103 shows an example of a signal profile obtained by observation in a real machine (in particular, referred to as a real signal profile in order to distinguish the signal profile from the ideal signal profile). For an observation target, a signal profile is extracted from an image of a spot where the expected value of the signal strength is uniform as in the graph 101, but the signal profile is affected by the temporal signal widening due to the signal processing delay in the detector of the real machine, which is different from that in the graph 101. A graph 104 shows the expected value of the PSD obtained based on the real signal profile of the graph 103. Unlike the graph 102, the expected value of the PSD is not a constant function since the influence of the temporal signal widening appears. Values of the PSD of one real signal profile are distributed with a variation around the expected value of the PSD shown in the graph 104.

The real signal profile shown in the graph 103 corresponds to a function obtained by performing convolution on the ideal signal profile shown in the graph 101 using a window function 105 corresponding to the signal processing delay of the real machine. The window function 105 is an unknown function. However, it is known that the convolution in the real space is equivalent to simple calculation of a product in a Fourier space. By using the theorem, it is possible to remove the influence of the temporal signal widening from the real signal profile to obtain data of the ideal signal profile.

First, the expected value of the PSD of the real signal profile is calculated by acquiring many real signal profiles and averaging the PSDs calculated based on these real signal profiles. The PSD calculated based on one signal profile varies around the expected value of the PSD shown in the graph 104 as described above, but expected value of the PSD of the real signal profile (that is, the graph 104) that is smooth and has clear characteristics can be obtained by averaging the PSDs calculated based on the many signal profiles in a spot to be measured.

Since the expected value of the PSD of the ideal signal profile (graph 102) is a constant function, the expected value of the PSD of the real signal profile (graph 104) is a constant multiple of the PSD of the window function 105 (graph 106) obtained by performing Fourier transform on the window function 105. The ideal signal profile can be regarded as white noise by extracting the signal profile from the image of the spot where the expected value of the signal strength is uniform as described above, and therefore, a situation in which the PSD of the ideal signal profile becomes a constant function on average can be realized.

Therefore, even if the window function 105 or the PSD of the window function 105 is unknown, the expected value of the PSD of the real signal profile (graph 104) can be obtained based on a real image, and the expected value can be regarded as the PSD of the window function 105 (graph 106) if a factor of the constant multiple is ignored. Alternatively, the PSD of the window function 105 may be obtained by multiplying entire expected values of the PSD of the real signal profile (graph 104) by a constant in order to adjust a value at a left end of the graph 104 to 1 or make an integral value of the PSD to be 1. This is because the factor of the constant multiple only affects a degree of contrast of the image. A function 106 corresponding to the PSD of the window function 105 obtained in this way is referred to as "calibration PSD" below.

In general, on the surface and inside of the sample, the variation in the signal obtained by scanning the spot where the material and the shape are constant hinders the inspection measurement as noise from a viewpoint of the inspection measurement using an image. Meanwhile, in the present embodiment, the calibration PSD 106 is obtained by actively utilizing the variation of the signal and utilizing the fact that the expected value of the PSD of the ideal signal profile in such a spot is a constant.

The step of obtaining the calibration PSD described above has the following characteristic processes. A first process is a step of acquiring image data of a spot, where a signal is white noise, such that an expected value 104 of the PSD of the real signal profile can be regarded as a product of the calibration PSD 106 and an expected value 102 of the PSD of the ideal signal profile which is a constant function. In the step, signals corresponding to the real signal profile 103 may be extracted from an entire image obtained by imaging a spot where signals other than random signals do not appear, and data processing may be performed on the extracted signals, or a spot where it is determined that signals other than random signals do not appear may be extracted from the image, the signals corresponding to the real signal profile 103 may be extracted from the spot, and the data processing may be performed on the extracted signals. In either case, it is required to perform a process of determining that signals in a spot used for calculating the PSD of the real signal profile include random signals that can be regarded as white noise.

Here, a method of acquiring the image data without irradiating the sample with a charged particle beam is inappropriate. It is because the calculation of the calibration PSD 106 requires the signal profile 103 that are signals acquired after the random signals having a certain high signal strength are affected by the window function 105. When the image data is acquired without irradiating the sample with the charged particle beam, since the random signals generated before passing through the window function 105 are substantially 0, the image data include noise generated in an electric circuit or the like. The random signals (noise) added in the electric circuit or the like after the influence of the window function 105 are only a calculation error. In the present embodiment, on the surface and inside of the sample that affects the signal strength, a spot where a material and a shape are constant is irradiated with the charged particle beam, so as to obtain image data. Accordingly, the random signals are affected by the window function 105 due to variations in the number of incident electrons per unit area, variations in the number of generated secondary electrons, and the like, and a real signal profile having a sufficient signal strength can be obtained. In other words, the real signal profile having sufficient signal strength means that the random signals (noise) added in the electric circuit or the like are less enough to be ignored. When the charged particle beam is emitted to acquire the image data, it may be considered that the condition is generally satisfied if an environment in which a device is provided is appropriate.

In order to appropriately acquire the calibration PSD, the charged particle beam device includes an input device with which an operator can determine and specify a specific spot, from which the image data is to be acquired, according to information of an observation target. Alternatively, the charged particle beam device includes a combination of a calculation device that filters an acquired image and outputs an index value corresponding to a component other than the noise and the input device with which the operator can specify a specific spot according to the index value. Alternatively, the charged particle beam device includes a calculation device that automatically specifies a specific spot according to the index value described above.

A second process is a step of calculating PSDs for a plurality of signal profiles and averaging the PSDs. An error of a PSD component of the random noise is 100%. In other words, a value of the PSD of one signal profile greatly varies from the expected value. Therefore, in order to obtain the calibration PSD 106 with high reliability, a step of acquiring many signal profiles and averaging the PSDs of the signal profiles is required. However, in the case of the present embodiment, obtaining many signal profiles is relatively easy since data to be handled is image data, that is, an aggregate of the plurality of signal profiles.

A process performed on a target image on which calibration of removing the influence of the temporal signal widening is desired to be performed is summarized below. First, a signal profile $I(i, x)$ extracted from an image or an image region having no data other than random signals is Fourier-transformed to obtain a Fourier coefficient $A(i, f)$. Here, i is a number of the signal profiles (i=1 to m), x is a position in a horizontal direction in the image, and f is a spatial frequency. The position in the horizontal direction is specified using a pixel as a unit. Next, a PSD of an i-th signal profile is calculated based on A(i, f), and the obtained m PSDs are averaged to obtain P(f). P(f) is the expected value of the PSD of the real signal profile in the spot where the expected values of the signal strength are uniform, and is the calibration PSD as described above.

On the other hand, the image on which the calibration is desired to be performed is decomposed into signal profiles. Each of the signal profiles is set as J(k, x). Here, k is a number of the signal profile (k=1 to n). Next, J(k, x) is Fourier-transformed to obtain a Fourier coefficient B(k, f). Since a relation (Math 1) is established between a Fourier coefficient B'(k, f) after calibration and the Fourier coefficient B(k, f), the Fourier coefficient B'(k, f) after the calibration is calculated using (Math 1).

$$\left.\begin{array}{l} B'(k, f) = C(f) \times B(k, f) \\ C(f) = \sqrt{\dfrac{1}{P(f)}} \end{array}\right\} \quad \text{[Math 1]}$$

Next, a calibrated signal profile J'(k, x) is obtained by performing inverse Fourier transform on B'(k, f). The process is repeated for n signal profiles to obtain a calibrated image based on the calibrated signal profile J'(k, x).

An example in which P(f) is obtained by obtaining the Fourier coefficient A(i, f) is described above, and P(f) is also obtained by obtaining an autocorrelation function R (I, r) based on I(i, x) and performing Fourier transform on an average of the autocorrelation function R(I, r). Since the two P(f) s are mathematically equivalent to each other, a calculation method using shorten calculation time may be selected.

First Embodiment

FIG. 2 shows a schematic diagram of a scanning electron microscope (SEM), which is an example of a charged particle beam device used for an inspection device. A housing 201 includes a column in which an electron optical system and a detection system are stored and a sample chamber in which a stage 208 on which a sample 207 (here, a silicon wafer) is placed is stored, and the housing 201 is maintained in a high vacuum state. The electron optical system includes, as main components, an electron gun 202 that emits an electron beam (primary electrons) 203, electron lenses (a focusing lens 204 and an objective lens 206) for focusing the electron beam 203 on the sample 207, and a deflector 205 that two-dimensionally scans the sample 207 with the electron beam 203. The deflector 205 two-dimensionally scans the sample 207 with the electron beam 203 by repeating scanning with a charged particle beam in an X-direction while shifting a position of the charged particle beam in a Y-direction orthogonal to the X-direction. The detection system includes a detector 210 that detects secondary electrons 209 emitted by an interaction between the electron beam 203 and the sample 207. Components constituting the electron optical system and the detection system are controlled by a control unit 211. A calculation unit (computer) 212 controls the electron optical system and the detection system through the control unit 211, and forms an image generated based on a detection signal that is output from the detector 210 and obtained by detecting the secondary electrons 209. A storage device 213 that stores control information and image information is connected to the calculation unit 212.

A silicon wafer with a step is shown as an example of the sample. FIG. 3 shows an observation spot of the sample. A top view 300 is a square spot having horizontal and vertical sides of 3000 nm. A cross-section 301 is a cross-section taken along a straight line A-B shown in the top view 300, and similarly, a cross-section 302 is a cross-section taken along a straight line C-D shown in the top view 300. In the top view 300, a boundary of the step is indicated by a thick line. In the top view 300, a spot 303 is a spot in which calibration data for calculating the calibration PSD is acquired, spots 304 and 305 are spots in which evaluation data for performing resolution evaluation is acquired, and the spots 303 to 305 are square spots each having sides of 512 nm.

FIG. 4 is an image 400 acquired by the scanning electron microscope for acquiring the calibration PSD. A spot on the sample corresponding to the image 400 is a part of the top view 300, and a spot corresponding to the calibration data spot 303 is indicated by a broken line in FIG. 4. Scanning of the electron beam performed by the scanning electron microscope is performed in a direction from a left side to a right side of a paper surface. An image acquired by a real scanning electron microscope is represented by, for example, a gray scale of 256 gradations, but in FIG. 4, for simplification, a portion that is particularly bright (the signal strength is high) is represented by white (solid line), and a portion that is dark (the signal strength is low) is represented by black. In the image generated based on the detection signal from the secondary electron detector, the signal strength is high at the step of the sample surface.

FIG. 5A shows a flowchart of calculating the calibration PSD. The calculation of the calibration PSD is executed by the calculation unit 212 according to an instruction from an operator. The calculation unit 212 includes hardware serving as the computer. That is, a processor calls out a program stored in a storage (for example, a hard disk drive (HDD), a solid state drive (SSD), or the like) to a memory (a random access memory (RAM)) and executes the program. The instruction from the operator is input from a GUI (graphic user interface) screen displayed on a monitor by using an input device such as a keyboard or a pointing device provided in the calculation unit 212. Before or in parallel with a start of the program for calculating the calibration PSD, the operator puts the wafer that is the sample into the scanning electron microscope and adjusts the stage and the optical system.

First, in step 501, the calculation unit 212 instructs, through the GUI displayed on the monitor of the calculation unit 212, the operator to image a periphery of a spot (calibration data spot) for obtaining the calibration PSD. In step 502, the operator controls the electron optical system and the detection system to scan, for example, an upper left spot of the top view 300 of the sample, and acquires a square image having sides of 1000 nm as shown in FIG. 4. A size of a pixel constituting the image is 0.5 nm, and therefore, the number of pixels in this case is 2000×2000. When the imaging is ended, the operator starts an algorithm of searching for the calibration data spot from the captured image.

In step 503, the calculation unit 212 analyzes an image captured by the operator (original image) and displays a recommended spot for acquiring the calibration data. FIG. 5B shows an example of a GUI screen 510 for displaying the recommended spot. The calculation unit 212 reads the original image, displays the original image on an original image display region 511 of the GUI screen 510, and displays the number of pixels of the original image on an image size display field 512. The operator sets the calibration data as a spot having a side of 512 nm (1024 pixels), and inputs the values to a calibration data spot size setting field 513.

The calculation unit 212 searches the original image for an optimum spot as a calibration data spot with a specified size. An example of the searching will be described. The original image is a set of values of the signal strengths arranged in 2000×2000, that is, a matrix. An average value of signal strengths in a 5×5 spot centered on itself is assigned to 1996×1996 pixels excluding 2 rows and 2 columns on an outer periphery. The process corresponds to applying an averaging filter of 5×5.

An array of the obtained averaged signal strength is set as P (x, y). Here, x and y are integers from 1 to 1996, and represent a position of a pixel. Next, an index Q shown in the following Math 2 is assigned to a variable (x, y) of the position.

$$Q(x, y) = \text{Abs}[P(x+5, y) - P(x, y)] + \text{Abs}[P(x, y+5) - P(x, y)] \quad \text{[Math 2]}$$

Here, Abs [α] is an absolute value of a. Incalculable spots exist at a right end and a lower end of the array, and the spots are out of an analysis target. In a spot to be analyzed, a spot having one side of 512 nm (1024×1024 pixels), that is, a spot in which values of the index Q for all pixels in the spot are a preset reference value or less is searched for, and a spot in which a total value of the index Q in the spot is the lowest is extracted.

The searching method using the index is an example, and the invention is not limited thereto. A plurality of search algorithms and indices may be provided for selection. In this case, a filter selection field 514 is provided on the GUI screen 510, and the operator selects a filter to be applied from the filter selection field 514 and clicks a search button 515 to start a search. When the averaging filter as described above is applied, a filter size may be variable and an input field of the filter size may be provided.

When searching for the calibration data spot is ended, the calculation unit 212 displays the extracted spot recommended as the calibration data spot to the operator. A display example is shown on the GUI screen 510 (FIG. 5B). In the example, a recommended spot 522 is displayed in a filtered image that is displayed in a filtered image display field 521. The filtered image is simply displayed in black and white in FIG. 5B, but is represented by shading using a pixel value as a value of the index Q, and becomes more blurred than the original image. A window for asking whether the recommended spot 522 can be used as the calibration data spot may pop up from the GUI screen 510.

In step 504, the operator determines the calibration data spot. When the operator selects to set the recommended spot 522 as the calibration data spot, the operator clicks a determination button 523. At this time, a white frame shown as the recommended spot 522 may be movable according to an instruction from the operator, and the operator may visually determine to move the white frame and then click the determination button 523. In that case, a spot of the white frame after the movement is set as the calibration data spot.

As described above, an example in which the calculation unit 212 displays the recommended spot for acquiring the calibration data is described, but the calculation unit 212 may simply display the original image on the GUI screen instead of searching for the recommended spot (step 503), so as to entrust the operator to set the calibration data spot. Conversely, a flow can also be set in which the spot searched for by the calculation unit 212 is automatically set as the calibration data spot without performing step 504.

In step 505, the selected square calibration data spot with a side of 512 nm (the number of pixels is 1024×1024) is cut out, and data thereof is divided into ribbon-shaped spots that are long in the X-direction. As described above, the X-direction is the scanning direction of the scanning electron microscope, and is a horizontal direction of the original image. A graph obtained by graphing the data of one ribbon-shaped spot corresponds to the graph 103. Accordingly, 1024 signal profiles each having 1024 pieces of data are obtained from the selected calibration data spot. The number is a sufficient number for performing averaging for calculating the calibration PSD.

As described above, the calibration PSD (P(f) in Math 1) is calculated by performing Fourier transform on the signal profiles to obtain the PSDs and averaging the PSDs of the obtained 1024 signal profiles. f is the spatial frequency shown in Math 3.

$$f = \Delta f \cdot s \quad \text{[Math 3]}$$

Here, Δf is a fundamental frequency, and is an inverse of a length of the calibration data spot 303 in the X-direction. s is a natural number.

The calculation unit 212 graphs the obtained calibration PSD and displays the obtained calibration PSD on the monitor in step 506, and requests the operator to select whether to store the data of the calibration PSD in step 507. The operator can determine, based on display of the graph of the calibration PSD (corresponding to the graph 104 in FIG. 1), whether sufficiently smooth data is obtained as the calibration PSD. When the operator selects to store the data of the calibration PSD, the process proceeds to step 508, the data of the calibration PSD is named to indicate a path to the storage device 213, and the data is stored together with data describing a condition at the time of acquiring the original image. Accordingly, a table of data corresponding to the calibration PSD (P(f)) is stored in the storage device 213, and thus the acquisition of the calibration PSD is ended.

On the other hand, when sufficiently smooth data is not obtained as the calibration PSD, the operator does not select storing the calibration PSD, and starts over from the determination of the calibration data spot (step 504).

In order to perform the resolution evaluation using the calibration PSD, the operator acquires a resolution evaluation image based on the spot 304 and the spot 305 shown in FIG. 3, and stores the resolution evaluation image in the storage device 213. Here, the number of pieces of data in a signal profile for the resolution evaluation image, an interval between adjacent pieces of data in each image, and a scanning speed (a time required for an electron beam to scan the interval between the adjacent pieces of data in each image) are required to align with the number of pieces of data in the signal profile used for acquiring the calibration PSD, an interval between adjacent pieces of data in each image, and a scanning speed. The number of pieces of data and the interval between adjacent pieces of data in each image are aligned in magnitude between the signal profiles to be subjected to Fourier transform and inverse Fourier transform. Since the temporal signal widening that is a problem to be solved by the present embodiment is caused by a delay of signal processing of the real machine with respect to the scanning speed of the electron beam, it is required to align a scanning speed between the signal profile of the resolution evaluation image and the signal profile for acquiring the calibration PSD.

Therefore, as a simplest method, a pixel size, an image size, and the scanning speed of the electron beam (or a setting parameter of the detection system related thereto) at the time of acquiring the resolution evaluation image may be matched with a pixel size, an image size, and the scanning speed of the electron beam at the time of acquiring a calibration data image. It is sufficient that the pixel size and the image size of the image are exactly aligned with a pixel size in the X-direction (the scanning direction of the electron beam) and an image size in the X-direction, and this is because the Fourier transform is performed on the signal profiles of the ribbon-shaped spots that are long in the X-direction to obtain the calibration PSD. However, even if these conditions in the image are different, no problem occurs as long as the scanning speed, the data interval, and the number of pieces of data are aligned between the signal profile of the resolution evaluation image and the signal profile for acquiring the calibration PSD at a stage of the signal profile. The acquisition of the resolution evaluation image may be performed before or after the acquisition of the calibration data image. Alternatively, an image including the calibration data spot and a resolution evaluation spot is captured at a time in advance, and the imaging result of each spot may be cut out.

The resolution evaluation is performed on an image in which blurring caused by the temporal signal widening is calibrated by executing a program of calibrating the influence of the temporal signal widening on the resolution evaluation image. FIG. 6 shows a flowchart of calibrating the influence of the temporal signal widening on the resolution evaluation image. The calculation unit 212 calls out and executes a program corresponding to the flow in FIG. 6 from the storage.

First, in step 601, the operator specifies a file name and calls out calibration PSD data (P(f)). Next, in step 602, the operator specifies a file name and calls out the resolution evaluation image data. In step 603, the calculation unit 212 collates the calibration PSD with a data file that is attached to each resolution evaluation image and describes a condition at the time of image acquisition, and the process proceeds to next step 604 if the pixel sizes, the image sizes, and the scanning speeds described above are the same. If the pixel sizes, the image sizes, and the scanning speeds described above are different, the process proceeds to step 605 and returns to step 601, and the operator is requested to re-specify the calibration PSD data having a matching condition.

In step 604, the calculation unit 212 divides the resolution evaluation image into the signal profiles. FIG. 7 shows a resolution evaluation image 700 before the calibration that is called out in step 602. The resolution evaluation image 700 is a result of imaging the spot 304 shown in FIG. 3, and a thick white line at the center of the image indicates a portion of silicon having a step. In the drawing, directions of X and Y coordinates for specifying a pixel position are shown. Both X and Y are pixel numbers, and each takes a value from 1 to 1024. Each of the signal profiles is an array of numerical values of brightness (that is, the signal strengths) of pixels having a fixed Y coordinate. The signal profile is denoted as J(k, x).

In step 606, the calculation unit 212 performs Fourier transform on J(k, x) (x=1 to 1024) to obtain a complex Fourier coefficient B(k, f). k is changed from 1 to k max (1024 in the present embodiment), and the Fourier coefficients B(k, f) of all the signal profiles of the resolution evaluation image 700 are obtained.

In step 607, the calculation unit 212 obtains B'(k, f) for all values of k according to Math 1. Next, in step 608, for all k (k=1 to 1024), B'(k, f) is subjected to inverse Fourier transform to obtain J'(k, x). In step 609, k max (1024) numerical value arrays J'(k, x) are regarded as the signal profiles, and the image is reconstructed by arranging the signal profiles J'(k, x) in the Y-direction in ascending order of k. The reconstructed calibrated image corresponds to an image obtained by replacing J(k, x) that is the brightness of each pixel of the resolution evaluation image 700 with J'(k, x). Subsequently, the image calibration is ended. The calculation unit 212 displays the calibrated image on the monitor, and the operator determines whether to store calibrated image data reconstructed in step 609 (step 610), names and stores the calibrated image data when the operator determines to store the calibrated image data (step 611), and the flow is ended.

FIGS. 8A and 8B show signal strength distributions of images obtained by performing and not performing calibration on the images of the spots 304 and 305 shown in FIG. 3 according to the flow shown in FIG. 6. FIG. 8A shows signal strength distributions of an image of the spot 304 at Y=512, and shows a range of the X coordinate of 350 to 650. FIG. 8B shows signal strength distributions of an image of the spot 305 at X=512, and shows a range of the Y coordinate of 350 to 650. As can be seen from the above, widening of a signal peak is serious in the X-direction than in the Y-direction before the calibration, and after the calibration, the widening of the signal peak in both the X-direction and the Y-direction is substantially the same. Since it can be said that a peak width after the calibration reflects resolution of an electron optical system from which the influence of the delay in the signal processing is removed, a state of the device can be more accurately grasped by managing the device state using the peak width after the calibration as a resolution index. For example, since the influence of the delay in the signal processing is removed from the calibrated image, it is easy to specify a remaining cause of blurring (the spatial signal widening, vibration of the stage, or the like).

In this way, in the first embodiment, a tailing phenomenon of the image can be eliminated by using the PSD of the window function corresponding to the signal processing delay in the detector, the PSD of the window function can be calculated based on the image of the calibration data spot imaged at a scanning speed used for an inspection and measurement, and thus the influence of the signal widening can be accurately removed over time with a small overhead, and the resolution evaluation of the charged particle beam device can be performed.

Second Embodiment

As the second embodiment, an inspection device will be described in which calibration PSDs for a plurality of imaging conditions are acquired in advance and stored in the inspection device, an inspection image is calibrated at a semiconductor manufacturing site using the stored calibration PSD, and an inspection is performed based on the calibrated inspection image. As a charged particle beam device used in the inspection device, the scanning electron microscope shown in FIG. 2 can be used in the same manner as in the first embodiment.

First, a step of acquiring the calibration PSD will be described. FIG. 9 shows an example of conditions set for an operator to acquire the calibration PSD. Here, four imaging parameters including an acceleration voltage of an electron beam, a size of one side of one pixel, the number of pixels of a calibration data spot, and a scanning time required to scan the calibration data spot once in an X-direction are provided. In this case, by combining the four imaging parameters, a total of 60 parameter sets are obtained. The imaging parameters are required to include information for specifying the pixel size of the image, the image size, and the scanning speed of the electron beam that are described in the first embodiment. As specifying conditions, specification can be performed under conditions other than the exemplified conditions as long as the number of pieces of data in a signal profile, an interval between adjacent pieces of data in each image, and a scanning speed (a time required for an electron beam to scan the interval between the adjacent pieces of data in each image) can be specified. Further, it can be expected to eliminate tailing in a scanning direction included in an acquired image is more appropriately by adding a parameter that affects blurring in the scanning direction generated due to a temporal signal widening. In the example, the acceleration voltage of the electron beam is added as the parameter. This is because as the number of electrons with which a sample is irradiated becomes larger, an influence on the acquired image is more likely to appear.

FIG. 10 shows an example of a sample (wafer) used for acquiring the calibration PSD. On the wafer, numbers ("23", "24", . . . ) are shallowly etched in a spot having a side of 5 μm, and a hole pattern 1001 for adjusting focus and astigmatism is etched to a right side by 1 μm separated from a number spot 1000. Numbers 01 to 99 are etched in the number spots 1000. The number is used for specifying a position at which a calibration data spot image is acquired. A set including the number spot 1000 with a certain number and the hole pattern 1001 is separated from a set with another number by 10 μm.

The operator acquires an image of a calibration data spot used for acquiring the calibration PSD for each of the 60 types of parameter sets. In this case, one condition of the conditions shown in FIG. 9, for example, one condition including the acceleration voltage of 500 V, the pixel size of 0.5 nm, the number of pixels of 512×512, and the scanning time of 2.5 ms is set, and imaging is started. The operator searches for the number indicated in the number spot 1000 on the sample, matches an optical condition using the hole pattern 1001 positioned on the right side of the number spot 1000, and then moves 4 μm from the hole pattern 1001 in a direction corresponding to right on a paper to capture an image, and stores the image. The spot to be imaged is a spot where a material and a shape are constant on a surface and inside of the sample that affects a signal strength. Subsequently, the parameter set is changed to a next parameter set, a number in a different number spot 1000 is searched for, and the imaging is repeatedly performed in the same procedure.

After the image of the calibration data spot is captured for all of the 60 types of parameter sets, the operator creates the calibration PSDs based on the images of the calibration data spot according to a procedure shown in FIG. 11. First, the operator calls out the acquired image of the calibration data spot (step 1101). In step 1102, the calculation unit 212 executes the same processing as step 505 in the flow in FIG. 5A. That is, the image of the calibration data spot is divided into ribbon-shaped spots that are long in the X-direction to obtain the same number of signal profiles as the number of pixels in a Y-direction of the image of the calibration data spot. The calibration PSD (P(f) in (Math 1)) is obtained by performing Fourier transform on each signal profile to obtain PSDs and averaging the obtained PSDs.

In step 1103, the calculation unit 212 executes the same processing as step 506 in the flow in FIG. 5A. The calculation unit 212 graphs the obtained calibration PSD and displays the obtained calibration PSD on the monitor, and requests the operator to select whether to store data of the calibration PSD in step 507. When the operator selects to store the data of the calibration PSD, the process proceeds to step 1104, the data of the calibration PSD is named to indicate a path to the storage device 213, and the data is stored together with data describing a condition at the time of acquiring the image of the calibration data spot. By applying the procedure shown in FIG. 11 to the image of the calibration data spot acquired for each of the 60 types of parameter sets, the acquisition of the calibration PSD under each imaging condition is ended.

In the second embodiment, a fine pattern is inspected using the inspection image in which the influence of the temporal signal widening calibrated by using the calibration PSD data stored in the storage device 213. FIG. 12 shows a flow of the inspection.

The operator puts a sample to be inspected into the device in FIG. 2, and acquires an image of a preset inspection portion (step 1201). FIG. 13A shows a schematic diagram of an example of a pattern appearing in an inspection image 1300. FIG. 14 shows an example of a GUI screen 1400 for executing the inspection. The calculation unit 212 displays the captured inspection image on an inspection image display region 1401. Among imaging conditions of the captured inspection image and the imaging conditions of the calibration PSD data, items desired to be matched by the operator are registered in advance and are displayed in a calibration data selection condition field 1402. In the example, the four imaging parameters selected for setting the parameters set at the time of acquiring the calibration PSD are displayed as items of imaging conditions to be matched. Next, in step 1202, the operator specifies a file name of the calibration PSD data that is considered to match the imaging conditions, and calls out the calibration PSD data. In the case of the GUI screen 1400, when the operator inputs the file name of the calibration PSD data in a file name input field 1403 and clicks a check button 1404, the calculation unit 212 collates the imaging conditions of the inspection image with the imaging conditions of the specified calibration PSD data (step 1203). When the imaging conditions are not matched, a result that the imaging conditions do not match (step 1205) is displayed on the GUI screen 1400, and the specification of the calibration PSD data is requested again (step 1202). On the other hand, when the imaging conditions are matched, a result that the imaging conditions match (step 1204) is displayed on the GUI screen 1400. Here, when the operator further clicks a trial button 1405, an image calibrated using the specified calibration PSD data is displayed on a calibrated inspection image display region 1406, and the operator can compare the calibrated inspection image with the inspection image before the calibration displayed on the inspection image display region 1401, and confirm that the calibration is appropriate. Although an example in which the calibration PSD is selected based on the imaging conditions is described, the calibration PSD may be selected based on conditions of the signal profile (the number of pieces of data, the interval between the adjacent pieces of data in each image, and the scanning speed (the time required for the electron beam to scan the interval between the adjacent pieces of data in each image)).

Hereafter, an inspection is executed using the calibration PSD data confirmed as being capable of being used to perform appropriate calibration. It is assumed that 85 portions on the sample are specified as inspection portions in advance. In step 1206, the calculation unit 212 images the 85 inspection portions, and calibrates the captured inspection images using the calibration PSD data automatically specified for the inspection images. FIG. 13B is a schematic diagram of a calibrated inspection image 1310 obtained by calibrating the captured inspection image 1300. It is assumed that an inspection content is a shortest distance d between a first pattern P1 and a second pattern P2 included in the inspection image. The calculation unit 212 reads a distance D' as the shortest distance d between the patterns from the calibrated inspection image. In step 1206, the imaging of the inspection portion, the calibration, and measurement of the distance performed based on the calibrated inspection image are performed at the 85 portions, and an average value and a standard deviation of the shortest distance d are calculated. In step 1207, the calculation unit 212 displays the average value and the standard deviation of the shortest distance d as inspection results, and automatically stores the inspection images before the calibration, the calibrated inspection images after the calibration, and measured values of the shortest distance d (step 1208). If the inspection results obtained in step 1207 are within an allowable range in device manufacturing, the target wafer is sent to a next step.

If the calibration using the calibration PSD data is not performed, as shown in FIG. 13A, blurring occurs in the inspection image 1300 in the scanning direction (X-direction) due to the temporal signal widening, and thus a distance D is read as the shortest distance d. Therefore, the shortest distance d between the first pattern P1 and the second pattern P2 is evaluated to be narrower than a real distance (distance D<distance D'). Accordingly, there is a high possibility that a pattern that is within the allowable range in fact is erroneously determined to be out of the allowable range. In the second embodiment, it is possible to perform measurement of an important portion related to the device manufacturing with higher accuracy by performing the inspection using the calibrated image, which can improve a yield.

REFERENCE SIGNS LIST

101, 102, 103, 104, 106 graph
105 window function
201 housing
202 electron gun
203 electron beam
204 focusing lens
205 deflector
206 objective lens
207 sample
208 stage
209 secondary electron
210 detector
211 control unit
212 calculation unit (computer)
213 storage device
300 top view
301, 302 cross-section
303, 304, 305 spot
400 image
510 GUI screen
511 original image display region
512 image size display field
513 calibration data spot size setting field
514 filter selection field
515 search button
521 filtered image display field
522 recommended spot
523 determination button
700 resolution evaluation image
1000 number spot
1001 hole pattern
1300 inspection image
1310 calibrated inspection image
1400 GUI screen
1401 inspection image display region
1402 calibration data selection condition field
1403 file name input field
1404 check button
1405 trial button
1406 calibrated inspection image display region

The invention claimed is:

1. A charged particle beam device comprising:
a charged particle optical system including a charged particle beam source configured to emit a charged particle beam, a plurality of lenses configured to focus the charged particle beam on a sample, and a deflector configured to scan the sample with the charged particle beam;
a detector configured to detect secondary charged particles, which are emitted due to an interaction between the charged particle beam and the sample, and output a detection signal; and
a calculation unit configured to calibrate first image data generated based on the detection signal output from the detector when the sample is two-dimensionally scanned with the charged particle beam, so as to generate second image data, wherein
the deflector two-dimensionally scans the sample with the charged particle beam by repeating scanning with the charged particle beam in a first direction while shifting a position in a second direction orthogonal to the first direction, and
the calculation unit generates the second image data using n first signal profiles each of which corresponds to a signal strength distribution in the first direction and which are extracted from the first image data, and a power spectral density P(f) (f: spatial frequency) of a window function corresponding to a signal processing delay in the detector.

2. The charged particle beam device according to claim 1, wherein
the calculation unit calculates a Fourier coefficient B'(k, f) based on a Fourier coefficient B(k, f) (k=1 to n), which is obtained by performing Fourier transform on the n first signal profiles, and the power spectral density P(f) of the window function corresponding to the signal processing delay in the detector, and generates the second image data based on n second signal profiles obtained by performing inverse Fourier transform on the Fourier coefficient B'(k, f), and
the Fourier coefficient B'(k, f), the Fourier coefficient B(k, f), and the power spectral density P(f) of the window function satisfy a relation of $$\left. \begin{array}{r} B'(k,f) = C(f) \times B(k,f) \\ C(f) = \sqrt{\dfrac{1}{P(f)}} \end{array} \right\}. \quad \text{[Math 1]}$$

3. The charged particle beam device according to claim 1, wherein
the calculation unit calculates, when a sample including a calibration data spot is two-dimensionally scanned with the charged particle beam, the power spectral density P(f) of the window function from third image data corresponding to the calibration data spot based on the detection signal output from the detector, and
the calculation unit calculates the power spectral density P(f) of the window function by calculating the power spectral densities of a Fourier coefficient A(i, f) (i=1 to m) obtained by performing Fourier transform on m third signal profiles each of which corresponds to the signal strength distribution in the first direction and which are extracted from the third image data, and averaging the m power spectral densities of the Fourier coefficient A(i, f).

4. The charged particle beam device according to claim 3, wherein
the first signal profile and the third signal profile have the same number of pieces of data, the same interval between adjacent pieces of data in each image, and the same time required for the charged particle beam to scan the interval.

5. The charged particle beam device according to claim 3, wherein
the first image data and the third image data have the same pixel size in the first direction, the same image size in the first direction, and the same scanning speed of the charged particle beam in the first direction when the image data is acquired.

6. The charged particle beam device according to claim 3, wherein
the calibration data spot is two-dimensionally scanned with the charged particle beam, and an expected value of a signal strength of the detection signal output from the detector is uniform.

7. The charged particle beam device according to claim 3, wherein
the calibration data spot is a spot in which a material and a shape are constant on a surface and inside of the sample that affect a signal strength of the detection signal output from the detector when being two-dimensionally scanned with the charged particle beam.

8. The charged particle beam device according to claim 3, wherein
the calculation unit extracts, from fourth image data generated based on the detection signal output from the detector when the sample including the calibration data spot is two-dimensionally scanned with the charged particle beam, a recommended spot that is recommended as the calibration data spot, and
the recommended spot is extracted based on an index value by applying a preset filter to signal strengths of the pixels constituting the fourth image data to obtain the index value for each of the pixels constituting the fourth image data.

9. An inspection device for inspecting a pattern formed on a sample at a plurality of inspection portions, the inspection device comprising:
a charged particle optical system including a charged particle beam source configured to emit a charged particle beam, a plurality of lenses configured to focus the charged particle beam on the sample, and a deflector configured to scan the sample with the charged particle beam;
a detector configured to detect secondary charged particles, which are emitted due to an interaction between the charged particle beam and the sample, and output a detection signal;
a calculation unit configured to calibrate first image data generated based on the detection signal output from the detector when the sample is two-dimensionally scanned with the charged particle beam, so as to generate second image data; and
a storage device configured to store a plurality of power spectral densities P(f) of a window function corresponding to a signal processing delay in the detector, wherein
the deflector two-dimensionally scans the sample with the charged particle beam by repeating scanning with the charged particle beam in a first direction while shifting a position in a second direction orthogonal to the first direction, and
the calculation unit generates the second image data using n first signal profiles each of which corresponds to a signal strength distribution in the first direction and which are extracted from the first image data and a first power spectral density P(f) (f: spatial frequency) of the window function called out from the storage device, and determines whether the pattern imaged in the first image data is defective based on the second image data.

10. The inspection device according to claim 9, wherein
the calculation unit calculates a Fourier coefficient B'(k, f) based on a Fourier coefficient B(k, f) (k=1 to n), which is obtained by performing Fourier transform on the n first signal profiles, and the first power spectral density P(f) of the window function, and generates the second image data based on n second signal profiles obtained by performing inverse Fourier transform on the Fourier coefficient B'(k, f), and
the Fourier coefficient B'(k, f), the Fourier coefficient B(k, f), and the first power spectral density P(f) of the window function satisfy a relation of $$\left.\begin{array}{l} B'(k, f) = C(f) \times B(k, f) \\ C(f) = \sqrt{\dfrac{1}{P(f)}} \end{array}\right\}. \qquad \text{[Math 2]}$$

11. The inspection device according to claim 9, wherein
when the sample including a calibration data spot is two-dimensionally scanned with the charged particle beam under each of a plurality of preset imaging conditions, the calculation unit calculates, based on the detection signal output from the detector, a plurality of the power spectral densities P(f) of the window function from a plurality of pieces of third image data corresponding to the calibration data spot, and stores the plurality of power spectral densities P(f) together with the imaging conditions in the storage device, and
the calculation unit calculates the power spectral density P(f) of the window function by calculating the power spectral densities of a Fourier coefficient A(i, f) (i=1 to m) obtained by performing Fourier transform on m third signal profiles each of which corresponds to the signal strength distribution in the first direction and which are extracted from the third image data, and averaging the m power spectral densities of the Fourier coefficient A(i, f).

12. The inspection device according to claim 11, wherein the calculation unit calls out the first power spectral density P(f) of the window function from the storage device such that the number of pieces of data, an interval between adjacent pieces of data in each image, and time required for the charged particle beam to scan the interval are equal between the first signal profile and the third signal profile.

13. The inspection device according to claim 11, wherein the calculation unit calls out the first power spectral density P(f) of the window function from the storage device such that a pixel size in the first direction, an image size in the first direction, and a scanning speed of the charged particle beam in the first direction when the image data is acquired are equal between the first image data and the third image data.

14. The inspection device according to claim 13, wherein the calculation unit further calls out the first power spectral density P(f) of the window function from the storage device such that an acceleration voltage of the charged particle beam when the first image data is acquired and an acceleration voltage of the charged particle beam when the third image data is acquired are equal to each other.

15. The inspection device according to claim 11, wherein the calibration data spot is two-dimensionally scanned with the charged particle beam, and an expected value of a signal strength of the detection signal output from the detector is uniform.

16. The inspection device according to claim 11, wherein the calibration data spot is a spot in which a material and a shape are constant on a surface and inside of the sample that affect a signal strength of the detection signal output from the detector when being two-dimensionally scanned with the charged particle beam.

17. The inspection device according to claim 9, wherein the calculation unit displays, on a monitor, a pattern imaged in the first image data and a calibrated pattern in the second image data.

* * * * *